US006835609B1

(12) United States Patent
Lee et al.

(10) Patent No.: US 6,835,609 B1
(45) Date of Patent: Dec. 28, 2004

(54) METHOD OF FORMING DOUBLE-GATE SEMICONDUCTOR-ON-INSULATOR (SOI) TRANSISTORS

(75) Inventors: Yong Meng Lee, Singapore (SG); Da Jin, Singapore (SG); Mau Lam Lai, Singapore (SG); David Vigar, Singapore (SG); Siow Lee Chwa, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/664,210

(22) Filed: Sep. 17, 2003

(51) Int. Cl.[7] .................... H01L 21/338; H01L 27/01
(52) U.S. Cl. .................... 438/183; 438/149; 257/347
(58) Field of Search ................ 257/332, 333, 257/347, 401; 438/149–158, 178, 183, 268–274

(56) References Cited

U.S. PATENT DOCUMENTS

| 6,118,161 | A | * | 9/2000 | Chapman et al. | ........... 257/401 |
| 6,365,465 | B1 | | 4/2002 | Chan et al. | ........... 438/283 |
| 6,396,108 | B1 | | 5/2002 | Krivokapic et al. | ........ 257/365 |
| 6,413,802 | B1 | | 7/2002 | Hu et al. | ........... 438/151 |
| 6,451,656 | B1 | | 9/2002 | Yu et al. | ........... 438/283 |
| 6,483,156 | B1 | * | 11/2002 | Adkisson et al. | ........... 257/401 |

* cited by examiner

*Primary Examiner*—Matthew Smith
*Assistant Examiner*—Calvin Lee
(74) *Attorney, Agent, or Firm*—George O. Saile; Rosemary L. S. Pike; Stephen G. Stanton

(57) ABSTRACT

A method of forming a double gated SOI channel transistor comprising the following steps. A substrate having an SOI structure formed thereover is provided. The SOI structure including a lower SOI silicon oxide layer and an upper SOI silicon layer. The SOI silicon layer is patterned to form a patterned silicon layer. A dummy layer is formed over the SOI silicon oxide layer and the patterned SOI silicon layer. The dummy layer is patterned to form a damascene opening therein exposing: a portion of the lower SOI silicon oxide layer; and a central portion of the patterned SOI silicon layer to define a source structure and a drain structure. Patterning the exposed lower SOI silicon oxide layer to form a recess. Gate oxide layer portions are formed around the exposed portion of the patterned SOI silicon layer. A planarized layer portion is formed within the final damascene opening. The planarized layer portion including a bottom gate and a top gate. The patterned dummy layer is removed to form the double gated SOI channel transistor.

52 Claims, 3 Drawing Sheets

US 6,835,609 B1

METHOD OF FORMING DOUBLE-GATE SEMICONDUCTOR-ON-INSULATOR (SOI) TRANSISTORS

FIELD OF THE INVENTION

The present invention relates generally to fabrication of semiconductor devices, and more specifically to methods of fabricating double-gate semiconductor-on-insulator (SOI) transistors.

BACKGROUND OF THE INVENTION

Double-gate transistors are not commonly used due to the significant challenges required in the manufacturing process despite the fact that they offer greater performance compared to conventional planar transistors.

U.S. Pat. No. 6,451,656 B1 to Yu et al. describes a double-gate transistor on semiconductor-on-insulator (SOI).

U.S. Pat. No. 6,413,802 B1 to Hu et al. describes a double-gate FinFFET on semiconductor-on-insulator (SOI).

U.S. Pat. No. 6,365,465 B1 to Chan et al. also describes a process for a double gate MOSFET on semiconductor-on-insulator (SOI).

U.S. Pat. No. 6,396,108 B1 to Krivokapic et al. describes a process for a double gate MOSFET on semiconductor-on-insulator (SOI).

SUMMARY OF THE INVENTION

Accordingly, it is an object of the present invention to provide improved methods of forming double gates silicon-on-insulator (SOI) transistors.

Other objects will appear hereinafter.

It has now been discovered that the above and other objects of the present invention may be accomplished in the following manner. Specifically, a substrate having an SOI structure formed thereover is provided. The SOI structure including a lower SOI silicon oxide layer and an upper SOI silicon layer. The SOI silicon layer is patterned to form a patterned silicon layer. A dummy layer is formed over the SOI silicon oxide layer and the patterned SOI silicon layer. The dummy layer is patterned to form a damascene opening therein exposing: a portion of the lower SOI silicon oxide layer; and a central portion of the patterned SOI silicon layer to define a source structure and a drain structure. Patterning the exposed lower SOI silicon oxide layer to form a recess. Gate oxide layer portions are formed around the exposed portion of the patterned SOI silicon layer. A planarized layer portion is formed within the final damascene opening. The planarized layer portion including a bottom gate and a top gate. The patterned dummy layer is removed to form the double gated SOI channel transistor.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Figure 1:
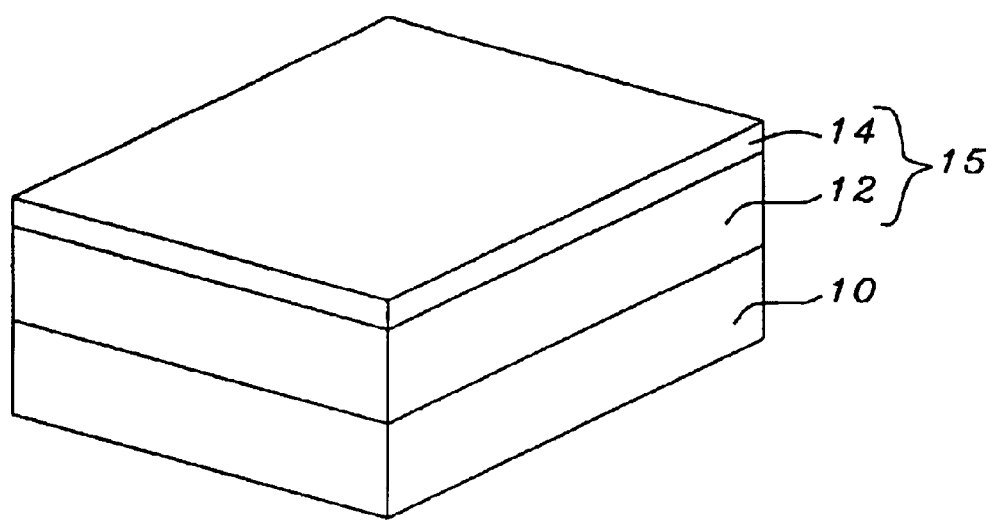
FIGS. 1 to 5 schematically illustrate a preferred embodiment of the present invention.

Initial Structure—FIG. 1

FIG. 1 schematically illustrates a structure 10 having a silicon-on-insulator structure (SOI) 15 formed thereover.

Structure 10 is preferably a semiconductor substrate comprised of silicon or germanium and is more preferably a silicon semiconductor substrate.

SOI 15 includes: a lower silicon oxide ($SiO_2$) layer 12 having a thickness of preferably from about 1000 to 5000 Å and more preferably from about 2000 to 4000 Å; and an overlying silicon (Si) layer 14 having a thickness of preferably from about 300 to 2000 Å and more preferably from about 500 to 1500 Å.

Figure 2:
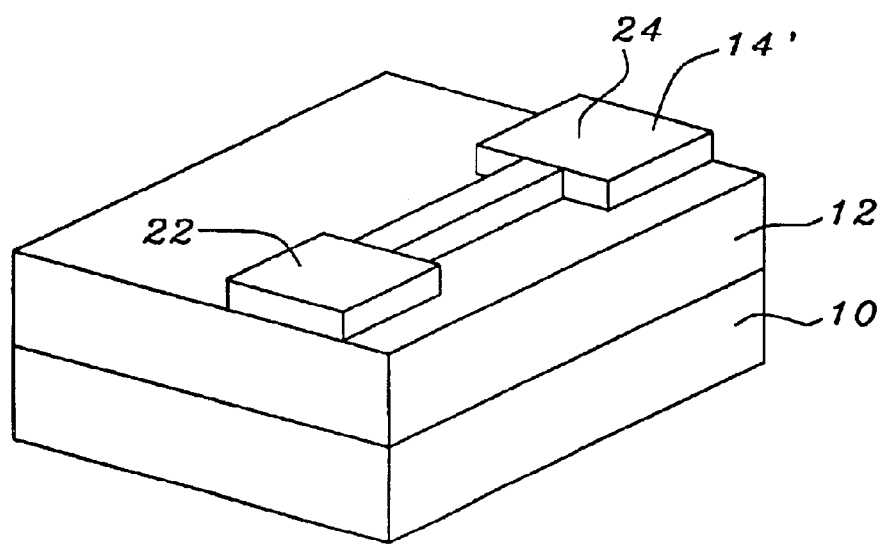

Patterning of Overlying Si Layer 14—FIG. 2

As shown in FIG. 2, the overlying silicon layer 14 of the SOI 15 is patterned to define patterned overlying silicon layer 14' and the active area as shown. The overlying silicon layer 14 may be patterned, for example, using an overlying patterned mask layer (not shown) preferably comprised of photoresist, a hardmask comprised of, for example, oxide, silicon oxide, nitride, silicon nitride, or a combination of oxide/silicon oxide and nitride/silicon nitride.

A bottom anti-reflective coating (BARC) layer (not shown) may also be used.

Patterned SOI silicon layer 14' is roughly in the shape of a dumbbell with the opposing ends being a source region 22 and drain region 24, respectively.

Figure 3:
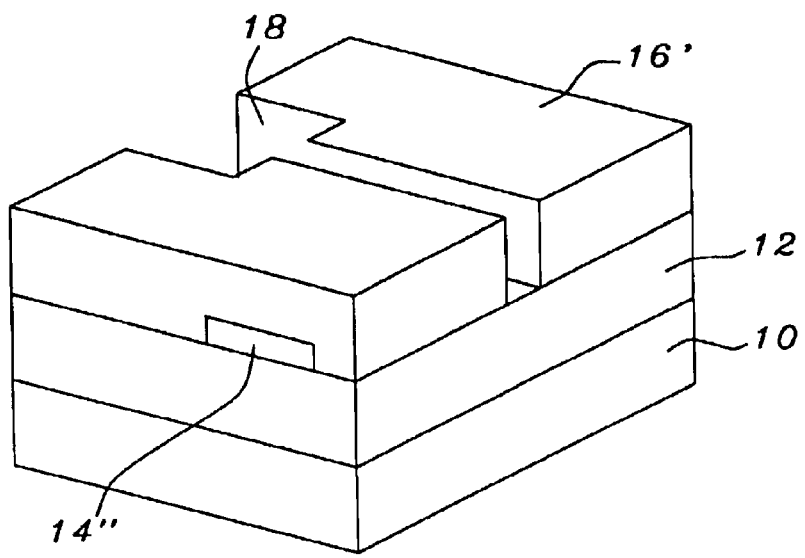

Formation of Patterned Dummy Nitride Layer 16—FIG. 3

As shown in FIG. 3, a dummy layer 16 is formed over lower $SiO_2$ layer 12 and patterned overlying silicon layer 14' to a thickness of preferably from about 1000 to 3000 Å and more preferably from about 1500 to 1500 Å. Dummy layer 16 is preferably comprised of nitride, silicon nitride, pad oxide/nitride, pad oxide/silicon nitride or silicon oxynitride (SiON) and is more preferably nitride as will be used hereafter for purposes of example.

Figure 4:
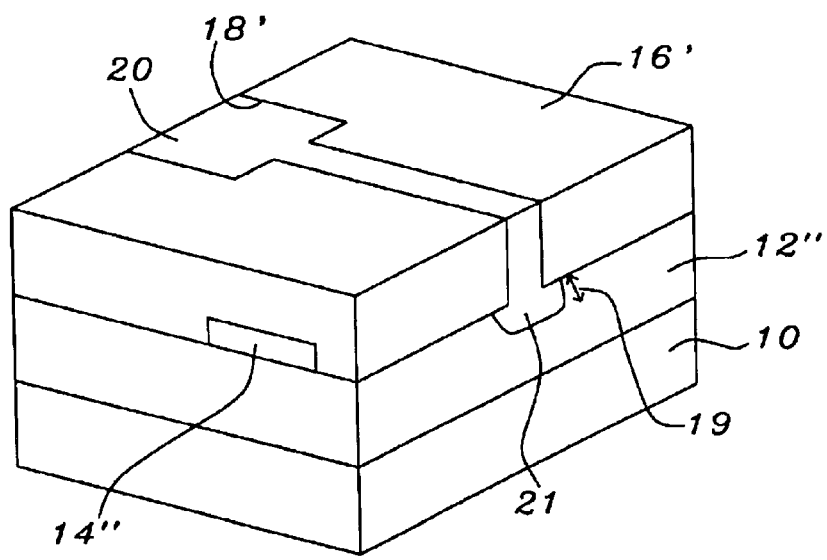
Figure 5:
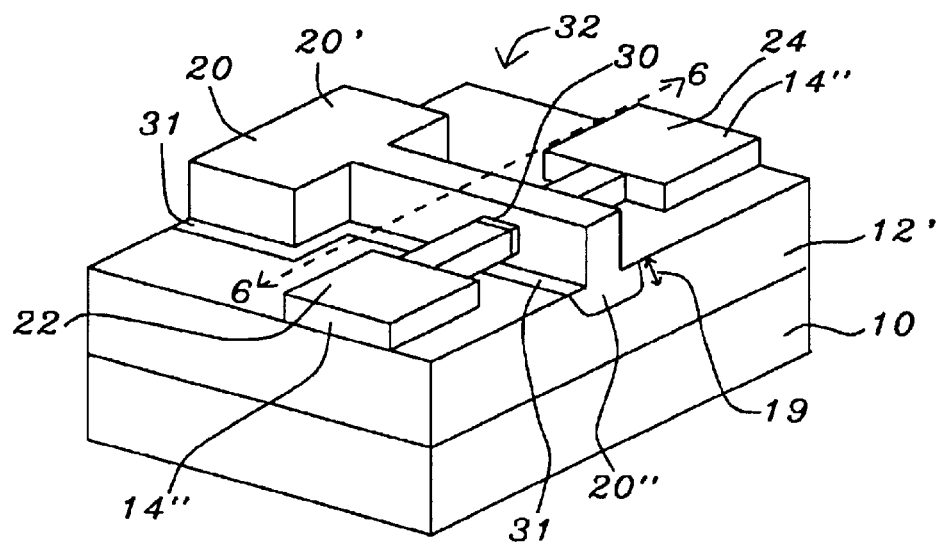
Figure 6:
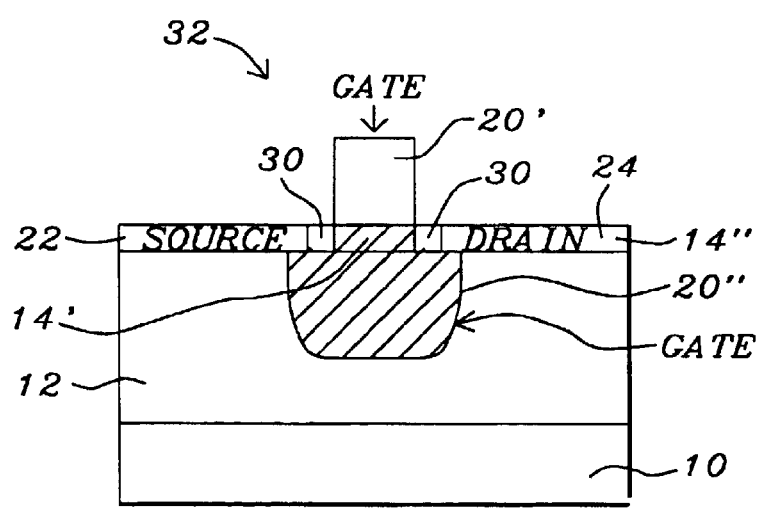
FIG. 6 is a cross-sectional view taken along line 6—6 of FIG. 5.

The dummy nitride layer 16 is then patterned to define a patterned top dummy nitride layer 16' overlying, and exposing a central portion of, silicon layer 14' (which will comprise the source 22 and drain 24 structures of the double gated SOI channel transistor structure 32 shown in FIGS. 5 and 6 once doped) and an initial damascene opening 18 therein. As shown in FIG. 4, a wet etch is then performed to etch lower $SiO_2$ layer 12 to form a recess 19. The wet etch is preferably an HF wet etch or a BOE wet etch and is more preferably an HF wet etch.

Recess 19 has a depth of preferably from about 500 to 3000 Å and more preferably from about 1000 to 2000 Å.

As shown in FIG. 4, any undercut 21 of the recess 19' within lower $SiO_2$ layer 12" is preferably minimized. Due to the undercut a layer of polysilicon 31 may be formed surrounding the gate.

Formation of Gate Oxide Layer 30—FIG. 4 (and FIG. 6)

A thin gate layer 30 (see FIG. 6) is then formed over the double patterned overlying silicon layer 14" exposed within the damascene opening 18 to a thickness of preferably from about 5 to 200 Å and more preferably from about 10 to 50 Å. Gate layer 30 is preferably comprised of oxide, silicon oxide, nitride, silicon nitride or another high-k material (where the dielectric constant k is greater than about 3.0) such as, for example, $HfSi_xO_2$ or $ZrO_2$. Thin gate layer 30 is preferably formed by a furnace oxidation process or a rapid thermal processing (RTP) process for oxide or silicon oxide and may be a chemical vapor deposition (CVD) process for other high-k gate layer 30 materials.

Formation of Planarized Poly Layer 20—FIG. 4

A layer is then formed over the patterned dummy nitride layer 16, filling the damascene opening 18. The layer is then planarized to remove the excess of the layer from over the patterned dummy nitride layer 16 to form a planarized layer 20 which will comprise the top gate 20' and bottom gate 20" of the double gated SOI channel transistor structure 32 shown in FIGS. 5 and 6.

Planarized layer 20 is preferably comprised of polysilicon (poly), tungsten (W), WN, aluminum (Al) or W—$Si_x$ and is more preferably polysilicon (poly) which will be used hereafter for purposes of example. Polysilicon layer 20 is preferably planarized using a chemical mechanical polishing (CMP) process or an anisotropic etchback process and is more preferably a CMP process.

Removal of Dummy Nitride Layer 16—FIG. 5

As shown in FIG. 5, the patterned dummy nitride layer 16 is removed to expose nascent transistor structure 32 that includes poly gate structure 20 having upper poly gate 20' and lower poly gate 20", the to-be-doped source 22 and drain 24 structures of double patterned overlying silicon layer 14" and the gate oxide layer 30 separating them.

The patterned dummy nitride layer 16 is preferably removed by a selective stripping process using hot phosphoric acid.

Lightly doped source/drain (LDD) and source/drain (S/D) doping is then performed into the source structure 22 and the drain structure 24, respectively, of the double patterned overlying silicon layer 14" to form the source 22 and drain 24 of the double gated SOI channel transistor 32.

FIG. 6 is a cross-sectional view of FIG. 5 along line 6—6 and illustrates the double gated SOI channel transistor 32 having lower gate 20", upper gate 20', source 22, drain 24 and gate oxide layer 30.

Advantages of the Invention

The advantages of one or more embodiments of the present invention include:

1) formation of a double gated SOI channel transistor without the need for epitaxial silicon growth;

2) formation of a double gated SOI channel transistor without the need for complicated device architectures;

3) formation of a double-gated 501 gate oxide with undamaged surfaces (unlike the FINFET disclosed in U.S. Pat. No. 6,413,802 B1 to Hu et al. (see Background of the Invention) where the oxide is formed over the etched surfaces); and 4) improved mobility due to the between oxide-substrate interface.

Some notable qualities of this invention include:

1) making use of the top and bottom surfaces of the SOI for gate oxide channel formation—due to the fact that both surfaces have low surface roughness, the mobility is improved;

2) gate oxide is formed all around the channel which is more like a circular FET rather than a planar FET; and 3) high-k materials like $HfSi_xO_2$ and $ZrO_2$ may be used as the gate oxide and W or WN may be used to form a metal gate instead of using polysilicon.

While particular embodiments of the present invention have been illustrated and described, it is not intended to limit the invention, except as defined by the following claims.

We claim:

1. A method of forming a double gated SOI channel transistor, comprising the steps of:

providing a substrate having an SOI structure formed thereover; the SOI structure including a lower SOI silicon oxide layer and an upper SOI silicon layer;

patterning the SOI silicon layer to form a patterned SOI silicon layer;

forming a dummy layer over the SOI silicon oxide layer and the patterned SOI silicon layer;

patterning the dummy layer to expose:

a portion of the lower SOI silicon oxide layer; and a central portion of the patterned SOI silicon layer; to form a damascene opening therein to define a source structure and a drain structure of the patterned SOI silicon layer;

patterning the exposed lower SOI silicon oxide layer to form a recess;

forming gate layer portions around the portion of the patterned SOI silicon layer exposed by the damascene opening;

forming a planarized layer portion within the damascene opening; the planarized layer portion including a bottom gate and a top gate; and removing the patterned dummy layer to form the double gated SOI channel transistor.

2. The method of claim 1, wherein the structure is a semiconductor substrate.

3. The method of claim 1, wherein the structure is comprised of silicon or germanium.

4. The method of claim 1, wherein the SOI silicon layer has a thickness of from about 300 to 2000 Å; the SOI silicon oxide layer has a thickness of from about 1000 to 500 Å; the dummy layer has a thickness of from about 1000 to 3000 Å; and the gate layer portions each have a thickness of from about 5 to 200 Å.

5. The method of claim 1, wherein the SOI silicon layer has a thickness of from about 500 to 1500 Å; the SOI silicon oxide layer has a thickness of from about 2000 to 4000 Å; the dummy layer has a thickness of from about 1500 to 2500 Å; and the gate layer portions each have a thickness of from about 10 to 50 Å.

6. The method of claim 1, wherein the dummy layer is comprised of nitride, silicon nitride or silicon oxynitride.

7. The method of claim 1, wherein the dummy layer is comprised of nitride.

8. The method of claim 1, wherein the exposed lower SOI silicon oxide layer is patterned from about 500 to 3000 Å deep.

9. The method of claim 1, wherein the exposed lower SOI silicon oxide layer is patterned from about 1000 to 2000 Å deep.

10. The method of claim 1, wherein the exposed lower SOI silicon oxide layer is patterned using an HF wet etch.

11. The method of claim 1, wherein the patterned lower SOI silicon oxide layer is undercut from about 500 to 3000 Å underneath the portions of the twice patterned SOI silicon layer.

12. The method of claim 1, wherein the patterned lower SOI silicon oxide layer is undercut from about 1000 to 2000 Å underneath the portions of the twice patterned SOI silicon layer.

13. The method of claim 1, wherein the gate layer is:

oxide or silicon oxide formed by a furnace oxidation process or a rapid thermal processing process; or a dielectric material having a dielectric constant of greater than about 3.0 formed by a chemical vapor deposition method.

14. The method of claim 1, wherein the gate layer is:

oxide or silicon oxide formed by a furnace oxidation process or a rapid thermal processing process; or a dielectric material such as $HSi_xO_2$ or $ZrO_2$ having a dielectric constant of greater than about 3.0 formed by a chemical vapor deposition method.

15. The method of claim 1, wherein the gate layer is oxide formed by a rapid thermal processing process.

16. The method of claim 1, wherein the planarized layer portion is comprised of polysilicon, tungsten, W—$Si_x$ or aluminum.

17. The method of claim 1, wherein the planarized layer portion is comprised of polysilicon.

18. The method of claim 1, including the step of doping the source structure and a drain structure after removal of the patterned dummy layer.

19. The method of claim 1, wherein the central exposed portion of the patterned SOI silicon layer has surfaces that are smooth.

20. A method of forming a double gated SOI channel transistor, comprising the steps of:
provideing a substrate having an SOI structure formed thereover; the SOI structure including a lower SOI silicon oxide layer and an upper SOI silicon layer;
patterning the SOI silicon layer to form a patterned SOI silicon layer;
forming a dummy layer over the SOI silicon oxide layer and the patterned SOI silicon layer;
patterning the dummy layer to expose:
  i) a portion of the lower SOI silicon oxide layer; and
  ii) a central portion of the patterned SOI silicon layer;
  to form a damascene opening therein to define a source structure and a drain structure of the patterned SOI silicon layer;
patterning the exposed lower SOI silicon oxide layer to form a recess;
forming gate layer portions around the portion of the patterned SOI silicon layer exposed by the damascene opening; the gate layer being comprised of:
  i) oxide or silicon oxide formed by a furnace oxidation process or a rapid thermal processing process; or
  ii) a dielectric material such as $HSi_xO_2$ or $ZrO_2$ having a dielectric constant of greater than about 3.0 formed by a chemical vapor deposition method;
forming a planarized layer portion within the damascene opening; the planarized layer portion including a bottom gate and a top gate; and
removing the patterned dummy layer to form the double gated SOI channel transistor.

21. The method of claim 20, wherein the structure is a semiconductor substrate.

22. The method of claim 20, wherein the structure is comprised of silicon or germanium.

23. The method of claim 20, wherein the SOI silicon layer has a thickness of from about 300 to 2000 Å; the SOI silicon oxide layer has a thickness of from about 1000 to 5000Å; the dummy layer has a thickness of from about 1000 to 3000 Å; and the gate layer portions each have a thickness of from about 5 to 200 Å.

24. The method of claim 20, wherein the SOI silicon layer has a thickness of from about 500 to 1500 Å; the SOI silicon oxide layer has a thickness of from about 2000 to 4000 Å; the dummy layer has a thickness of from about 1500 to 2500 Å; and the gate layer portions each have a thickness of from about 10 to 50 Å.

25. The method of claim 20, wherein the dummy layer is comprised of nitride, silicon nitride or silicon oxynitride.

26. The method of claim 20, wherein the dummy layer is comprised of nitride.

27. The method of claim 20, wherein the exposed lower SOI silicon oxide layer is patterned from about 500 to 3000 Å deep.

28. The method of claim 20, wherein the exposed lower SOI silicon oxide layer is patterned from about 1000 to 2000 Å deep.

29. The method of claim 20, wherein the exposed lower SOI silicon oxide layer is patterned using an HF wet etch.

30. The method of claim 20, wherein the patterned lower SOI silicon oxide layer is undercut from about 500 to 3000 Å underneath the portions of the twice patterned SOI silicon layer.

31. The method of claim 20, wherein the patterned lower SOI silicon oxide layer is undercut from about 1000 to 2000 Å underneath the portions of the twice patterned SOI silicon layer.

32. The method of claim 20, wherein the gate layer is oxide formed by a rapid thermal processing process.

33. The method of claim 20, wherein the planarized layer portion is comprised of polysilicon, tungsten, W—$Si_x$ or aluminum.

34. The method of claim 20, wherein the planarized layer portion is comprised of polysilicon.

35. The method of claim 20, including the step of doping the source structure and a drain structure after removal of the patterned dummy layer.

36. The method of claim 20, wherein the central exposed portion of the patterned SOI silicon layer has surfaces that are smooth.

37. A method of forming a double gated SOI channel transistor, comprising the steps of:
providing a substrate having an SOI structure formed thereover; the SOI structure including a lower SOI silicon oxide layer and an upper SOI silicon layer;
patterning the SOI silicon layer to form a patterned SOI silicon layer;
forming a dummy layer over the SOI silicon oxide layer and the patterned SOI silicon layer; the dummy layer being comprised of nitride, silicon nitride or silicon oxynitride;
patterning the dummy layer to expose:
  i) a portion of the lower SOI silicon oxide layer; and
  ii) a central portion of the patterned SOI silicon layer;
  to form a damascene opening therein to define a source structure and a drain structure of the patterned SOI silicon layer;
patterning the exposed lower SOI silicon oxide layer to form a recess; forming gate layer portions around the portion of the patterned SOI silicon layer exposed by the damascene opening; the gate layer being comprised of:
  i) oxide or silicon oxide formed by a furnace oxidation process or a rapid thermal processing process; or
  ii) a dielectric material such as $HSi_xO_2$ or $ZrO_2$ having a dielectric constant of greater than about 3.0 formed by a chemical vapor deposition method;
forming a planarized layer portion within the damascene opening; the planarized layer portion including a bottom gate and a top gate; and
removing the patterned dummy layer to form the double gated SOI channel transistor.

38. The method of claim 37, wherein the structure is a semiconductor substrate.

39. The method of claim 37, wherein the structure is comprised of silicon or germanium.

40. The method of claim 37, wherein the SOI silicon layer has a thickness of from about 300 to 2000 Å; the SOI silicon oxide layer has a thickness of from about 1000 to 5000 Å; the dummy layer has a thickness of from about 1000 to 3000

Å; and the gate layer portions each have a thickness of from about 5 to 200 Å.

41. The method of claim 37, wherein the SOI silicon layer has a thickness of from about 500 to 1500 Å; the SOI silicon oxide layer has a thickness of from about 2000 to 4000 Å; the dummy layer has a thickness of from about 1500 to 2500 Å; and the gate layer portions each have a thickness of from about 10 to 50 Å.

42. The method of claim 37, wherein the dummy layer is comprised of nitride.

43. The method of claim 37, wherein the exposed lower SOI silicon oxide layer is patterned from about 500 to 3000 Å deep.

44. The method of claim 37, wherein the exposed lower SOI silicon oxide layer is patterned from about 1000 to 2000 Å deep.

45. The method of claim 37, wherein the exposed lower SOI silicon oxide layer is patterned using an HF wet etch.

46. The method of claim 37, wherein the patterned lower SOI silicon oxide layer is undercut from about 500 to 3000 Å underneath the portions of the twice patterned SOI silicon layer.

47. The method of claim 37, wherein the patterned lower SOI silicon oxide layer is undercut from about 1000 to 2000 Å underneath the portions of the twice patterned SOI silicon layer.

48. The method of claim 37, wherein the gate layer is oxide formed by a rapid thermal processing process.

49. The method of claim 37, wherein the planarized layer portion is comprised of polysilicon, tungsten, W—$Si_x$ or aluminum.

50. The method of claim 37, wherein the planarized layer portion is comprised of polysilicon.

51. The method of claim 37, including the step of doping the source structure and a drain structure after removal of the patterned dummy layer.

52. The method of claim 37, wherein the central exposed portion of the patterned SOI silicon layer has faces that are smooth.

* * * * *